(12) United States Patent  (10) Patent No.: US 8,547,687 B2
De Rijck et al.  (45) Date of Patent: Oct. 1, 2013

(54) POWER SEMICONDUCTOR DEVICE ADAPTIVE COOLING ASSEMBLY

(75) Inventors: Alexander Christiaan De Rijck, Eindhoven (NL); Hendrik Huisman, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 355 days.

(21) Appl. No.: 13/122,807

(22) PCT Filed: Oct. 1, 2009

(86) PCT No.: PCT/IB2009/054301
§ 371 (c)(1),
(2), (4) Date: Apr. 6, 2011

(87) PCT Pub. No.: WO2010/041175
PCT Pub. Date: Apr. 15, 2010

(65) Prior Publication Data
US 2011/0194256 A1  Aug. 11, 2011

(30) Foreign Application Priority Data
Oct. 7, 2008 (EP) .................................... 08165960

(51) Int. Cl.
*H05K 7/20* (2006.01)
(52) U.S. Cl.
USPC ...... 361/676; 361/679.46; 361/688; 361/717; 700/300; 62/161

(58) Field of Classification Search
USPC ....... 361/676–678, 679.46–679.47, 688–690, 361/695–701, 717–718
See application file for complete search history.

(56) References Cited

U.S. PATENT DOCUMENTS

| 5,569,950 A | 10/1996 | Lewis et al. | |
|---|---|---|---|
| 5,869,891 A | 2/1999 | Rostoker et al. | |
| 6,116,040 A | 9/2000 | Stark | |
| 6,654,894 B2 * | 11/2003 | Kaminski et al. | 713/300 |
| 7,382,620 B2 | 6/2008 | Khanna et al. | |
| 8,233,273 B2 * | 7/2012 | Chen et al. | 361/679.46 |
| 2005/0039465 A1 | 2/2005 | Welch | |
| 2008/0130705 A1 * | 6/2008 | Chen et al. | 374/43 |
| 2008/0174959 A1 * | 7/2008 | Sano et al. | 361/695 |
| 2008/0205000 A1 * | 8/2008 | Ye et al. | 361/697 |

FOREIGN PATENT DOCUMENTS

| DE | 10233836 | 2/2004 |
|---|---|---|
| WO | 2004011861 | 2/2004 |
| WO | 2005043618 | 5/2005 |

OTHER PUBLICATIONS

Murdock et al: "Active Thermal Control of Power Electronic Modules"; IEEE Transactions on Industry Applications, vol. 42, No. 2, Mar./Apr. 2005, pp. 552-558.

* cited by examiner

*Primary Examiner* — Courtney Smith (57) ABSTRACT

The invention relates to a power semiconductor device (100) cooling assembly for cooling a power semiconductor device (100), wherein the assembly comprises an actively cooled heat sink (102) and a controller (208; 300), wherein the controller (208; 300) is adapted for adjusting the cooling efficiency of the heat sink (102) depending on the temperature of the high current carrying semiconductor junction comprised in the power semiconductor device (100).

9 Claims, 4 Drawing Sheets

POWER SEMICONDUCTOR DEVICE ADAPTIVE COOLING ASSEMBLY

TECHNICAL FIELD

The invention relates to a power semiconductor device cooling assembly for cooling a power semiconductor device, a nuclear magnetic resonance examination system comprising a power semiconductor device cooling assembly, a method of operating a power semiconductor device cooling assembly and a computer program product.

BACKGROUND AND RELATED ART

Usually, power semiconductor devices are mounted onto large heat sinks with or without extra cooling measures, such as fan cooling or fluid cooling. Power semiconductor devices are semiconductor devices used as switches or rectifiers in power electronic circuits. Examples are power diodes, Thyristors, IGBTs (insulated gate bipolar transistors) and power MOSFETs.

Heat sinks with or without extra cooling measures are designed in such a manner that in case of full power demand the temperature of the power semiconductor device remains below the absolute maximum as defined by its specifications. When the power demand is lowered or stopped, the cooling system keeps on transferring heat in the same rate as for full power, causing the temperature of the complete cooling system, i.e. the heat sink and the components mounted to it, to decrease very rapidly. When the power demand is increased again, the temperature will also rise another time.

If the power semiconductor device is repetitively used at maximum power alternated with short time intervals in which no or only low power is needed, the temperature of the power semiconductor device will vary between the periods of full power demand in which the temperature will rise to its maximum and the periods of low or no power demand, in which the device temperature will decrease rapidly due to the cooling capacity of the implemented heat sink and, if available, cooling system. In this way, the device temperature will possibly experience large temperature variations.

For example U.S. Pat. No. 6,116,040 does disclose an apparatus for cooling of electronics of a variable frequency drive associated with a refrigerant compressor. By means of the compressor drive, the temperature of the power electronics is maintained in a desired temperature range.

The lifetime of semiconductor devices is determined by several processes which each lead to a deterioration of the intended device characteristics over time up to the complete failure of the device. For power semiconductors, one of the most important processes is mechanical stress due to thermal cycling. Due to the finite thermal resistance between the semiconductor die and the base upon which it is mounted and the differences in the thermal expansion coefficients of the materials involved, changes in power dissipation over time inevitably lead to thermal stresses. These stresses can lead to material fatigue, manifesting itself in rupture of bond wires and/or degradation of the soldering connection between the die and the base upon which it is mounted.

Rupture of bond wire can either lead to direct device failure or to further increased stress to other bond wires in the case that multiple bond wires are connected in parallel, as it is often the case in power semiconductor modules.

As a consequence, if power semiconductor devices are repetitively used at maximum power alternated with intervals of time in which no or low power is needed, the temperature of such power devices even when mounted on large heat sinks with or without extra cooling measures will vary greatly between the periods of full power demand. As a consequence, the die temperature will experience large temperature variations which will reduce the lifetime of the power semiconductor device.

U.S. Pat. No. 5,569,650 relates to an electronic chip cooling device and more particularly to a device which provides active cooling to reduce temperature excursions of electronic chips, which will limit thermal fatigue, increase product lifecycle, allow for larger chips and permit chips to be directly attached to substrates with unmatched coefficients of thermal expansion with less reliability concerns. In an embodiment, an electronic chip is attached to the substrate and a thermal electric cooling device is secured to the exposed surface of the chip. A temperature sensing means such as a thin film thermal couple is attached between the cold side of the thermal electric cooling (TEC) device and the chip. The temperature sensing means may alternative be built into the chip or the electronic package adjacent to the interconnection between the TEC device and the chip. Further, a heat sink is provided which is secured to the hot side of the TEC device. An output of the thermal couple is coupled to a feedback control circuit.

WO 2005/043618 A does disclose a method and arrangement in connection with an inverter that comprises several power semiconductor components and a control apparatus arranged to control them, the control apparatus being arranged to control the power semiconductor components in response to a control quantity to generate an output voltage.

US 2005/039465 A1 does disclose a cooling system for audio equipment which uses a temperature sensor and a Peltier effect module in a feedback control loop. The cooling system reads the temperature sensor to obtain the temperature of an audio component of the equipment and adjusts the drive for the Peltier effect module that cools the audio component to prevent overheating of the component.

DE 10233836 A1 does disclose an electronic control unit comprising a housing which comprises various electronic components, wherein the electronic components are required to be driven below a maximum temperature. For cooling the electronic components a Peltier element is provided.

SUMMARY OF THE INVENTION

The present invention provides a power semiconductor device cooling assembly for cooling a power semiconductor device, wherein the assembly comprises an actively cooled heat sink and a controller, wherein the controller is adapted for adjusting dynamically the cooling efficiency of the heat sink depending on the temperature of the high current carrying semiconductor junction comprised in the power semiconductor device.

The assembly has the advantage, that the lifetime of power semiconductor devices is drastically increased due to the fact, that the controller is permanently able to regulate the cooling efficiency of the heat sink depending on the temperature of the most critical and fault prone part of a power semiconductor device, namely the high current carrying semiconductor junction of the power semiconductor device which is the source of heat development during operation of the power semiconductor device. By means of the power semiconductor device cooling assembly, thermal cycling of the power device and especially of the high current carrying semiconductor junction can be reduced which as a consequence will also reduce the mentioned thermal stresses between the high current carrying semiconductor junctions or in general the die and the base upon which the junctions or the die are mounted. This leads to a significant increase of the lifetime of the device. The smaller the thermal cycle amplitude is made, the higher is the number of cycles the power device can handle, and thus the higher is the lifetime of the power semiconductor device.

It is to be noted, that one key feature of the present invention is the fact, that the cooling efficiency of the heat sink is adjusted depending on the temperature of the high current carrying semiconductor junction comprised in the power semiconductor device. In case only for example a cooling assembly would be provided for maintaining the temperature of the heat sink itself in a certain range, due to the large thermal capacity of the heat sink in comparison with the power semiconductor device, the heat sink will follow a temperature change of the high current carrying semiconductor junction rather slowly which has the consequence, that on average the temperature of the heat sink may be maintained at a rather constant level, whereas at the same time the temperature of the high current carrying semiconductor junction is cycling over a large range. By means of the power semiconductor device adaptive cooling assembly, the temperature of critical parts of the power semiconductor device can be maintained within a certain temperature range at much higher accuracy since an adjustment of the cooling efficiency of the heat sink is not performed with respect to the temperature of the heat sink but with respect to the temperature of the high current carrying semiconductor junction.

In accordance with an embodiment of the invention, the controller is adapted for receiving a temperature signal, the temperature signal specifying an actual temperature value of the high current carrying semiconductor junction, wherein the controller is adapted for adjusting the cooling efficiency of the heat sink depending on the temperature signal. Either said temperature value is a directly measured value at the position of the high current carrying semiconductor junction, or this value is a temperature value adequately reconstructed and calculated based on other available signals. Such a signal may for example be a desired or measured output power level of the power semiconductor device or the apparatus it is used in.

In other words, an adjustment of the cooling efficiency of the heat sink can either be performed by means of a feedback controller which uses the real actual temperature of the high current carrying semiconductor junction for example measured by a sensor being logically attached close to or even directly to said junction, or it can use a feedforward controller which performs said adjustment of the cooling efficiency of the heat sink using a predicted thermal power dissipation of the power semiconductor device using a model, the model being adapted for predicting the thermal power dissipation against the desired or measured output power level of the power semiconductor device. A further alternative is a combination of both types of controller, i.e. the combination of a feedback and a feedforward controller.

Such a combination may in accordance with an embodiment of the invention comprise a selection module adapted for selecting between a feedback control mode and a feedforward control mode for adjusting the cooling efficiency, wherein in the feedback mode the adjustment of the cooling efficiency is performed depending on the temperature signal and wherein in the feedforward mode the adjustment of the cooling efficiency is performed depending on the desired or measured output power level of the power semiconductor device using the model, wherein the selection module is adapted to perform the selection based on the signal quality of the temperature signal.

In accordance with an embodiment of the invention, also a combination of a feedback and a feedforward controller can be used, wherein under 'normal' operation conditions the feedback controller is used and wherein only under 'difficult' conditions the feedback controller is substituted by the feedforward controller. Such 'difficult' situations may comprise circumstances in which a stability of the feedback control loop is not guaranteed anymore. For example, in case the output power of the semiconductor device is oscillating over time, strong oscillations of temperature variations could build up so strong such that the temperature variation are not reflecting any more the real temperature behavior of the semiconductor junction. In this case the controller may decide to switch to the feedforward control operation mode in which the temperature variation of the high current carrying semiconductor junction is adequately predicted using a model. In this case, an uncontrolled or unwanted build up of temperature oscillations of the heat sink and/or the high current carrying semiconductor junction can be prevented.

Nevertheless, also a pure operation in only the feedback or the feedforward mode has its own advantages. One advantage of the feedback mode is that this mode is less sensitive to modeling errors and also more accurate. An advantage of the feedforward mode is that a high stability of the control loop in a closed loop control system can be provided. Both implementations will reduce temperature changes of the high current carrying semiconductor junction and will thus increase the lifetime of the power semiconductor device.

In accordance with a further embodiment of the invention, the controller is further adapted for adjusting the cooling efficiency of the heat sink depending on a combined temperature signal, the controller being adapted to generate the combined temperature signal by a weighted combination of the predicted thermal power dissipation of the power semiconductor device and the temperature signal in the time domain and/or the frequency domain. For example, the combined temperature signal can be obtained by a noise weighted combination in the frequency domain. This is the embodiment preferred over an exclusive switching between only a feedback or a feedforward mode since this has the advantage that in an optimized manner a highly accurate temperature determination of the junction can be performed and used for adjusting the cooling efficiency of the heat sink.

In general, a measured temperature signal and the predicted temperature will have very different characteristics. For example, a signal physically measured in a device switching at high currents and/or voltages will often have a low signal to noise ratio. However, this noise can very well be located in a small frequency band around the switching frequency of the device and be removed using for example a bandstop filter. In this bandstop frequency region, the predicted signal can be used instead such that as a result, a combined temperature signal is used for adjusting the cooling efficiency of the heat sink. In frequency bands lying outside the bandstop frequency region, the actually measured temperature signal is used, whereas in the bandstop frequency region, the predicted signal is used. However, in general, any kinds of parameters can be used as criteria for performing the weighted combination of the measured temperature signal and the predicted temperature like the actual model input, thermal resistances and capacitances, and actual losses per switching action.

In other words, the best overall temperature signal with highest accuracy can be obtained by weighted combining of both signals produced with both methods, i.e. the real measurement and the prediction. This can be done for example by using a certain frequency band of one signal and the complementary frequency band of the other signal, or using one signal in a certain time interval and the other in the remaining time, and combinations of these.

In accordance with an embodiment of the invention, the mentioned signal quality of the temperature signal is given by the noise level in the temperature signal, for example due to EMI-disturbances, which may play an important role. In case of strong noise, by means of the selection module which selects between the feedback and the feedforward mode based on the signal quality of the temperature signal it is then possible to switch from the feedback to the feedforward mode which may be less accurate regarding a temperature prediction of the actual junction temperature but nevertheless ensures that an adequate control of the cooling efficiency of the heat sink is still possible even in case of such extreme situations.

In accordance with an embodiment of the invention, the power semiconductor device is operable with a switching frequency, wherein the controller is further adapted for adjusting the switching frequency depending on the desired or measured output power level of the power semiconductor device. One example of a power semiconductor device operable with a switching frequency is for example an H-bridge or a high frequency PWM (pulse with modulated) power control system. In such systems, the system temperature is determined by two major heat sources. The first heat source is the switching of the device and the second heat source is the already mentioned load current flowing through the device. As a consequence, the temperature inside the device can be controlled by the two variables switching frequency and output current. As a consequence, the temperature of the high current carrying semiconductor junction can be controlled by changing the switching frequency in correspondence to the load current, such that high currents together with low switching frequencies are used and vice versa. If the device is used at full power the nominal lowest switching frequency is used, but as soon as the load reduces the frequency is increased to generate more losses in the device without actually delivering power to the external system in order to keep the temperature within the device as constant as possible. Such a method is for example known from Murdock, Torres, Conners and Lorenz in 'Active Thermal Control of Power Electronics Modules', IEEE Transactions on Industry Applications, Vol. 42, no. 2, pages 552-558.

The advantage of this configuration is that the extra losses are generated exactly at the location needed, which is the high current carrying semiconductor junction. By combining this configuration with a feedforward or feedback control system mentioned above, the temperature of the power semiconductor device can be even controlled more accurately. The reason is the time required for temperature equilibration between the heat sink and the high current carrying semiconductor junction. Even in case the system is able to measure accurately an actually rising temperature of the junction, an immediately enhanced cooling efficiency of the heat sink will, due to the limited temperature conductivity of typical used materials, become effective to limit the temperature raise only after a certain amount of time has passed by. In the meantime, by for example additionally reducing the switching frequency of the system, the temperature rise can be further damped. In other words, by adjusting the switching frequency in combination with the mentioned usage of a feedback or feedforward control, temperature variations can be further smoothened and the rate of temperature rise can be efficiently limited which will further increase the lifetime of power semiconductor devices using the power semiconductor device cooling assembly.

In accordance with a further embodiment of the invention, the heat sink is thermally isolated against the environment. This has the advantage that heat stored in the heat sink cannot flow off anymore which will keep the temperature of the heat sink relatively constant for example during a time interval of no or low power demand. The only decrease in temperature is caused by thermal equalization of temperature differences within the mass of the heat sink caused by the used cooling medium like a liquid or air and the temperature leak through the thermal insulation, which is rather small. As soon as the power device needs to deliver full power again, the cooling capacity of the heat sink is restored to its maximum value. As a consequence, the amplitude of the temperature cycles of the power semiconductor device and especially of the semiconductor device junctions is greatly reduced because the heat sink temperature is kept as constant as possible, even in periods in which no or low power is needed.

In another aspect, the invention relates to a nuclear magnetic resonance examination system comprising the assembly according to the invention. For example, in nuclear magnetic resonance examination systems gradient amplifiers are used which comprise high power semiconductor devices. When nuclear magnetic resonance imaging scans are made typically the gradient amplifiers are used at full power, while regular short intervals exist in which no power is demanded due to the fact that the magnetic resonance systems need to switch between different scan types, or because the operator needs some time to evaluate a scan before starting a new one or because a new patient needs to be positioned in the apparatus. The timeframes of these periods without power demand of the gradient amplifiers lie in the range from seconds to minutes. By means of the nuclear magnetic resonance examination system comprising the assembly the temperature oscillations of the power semiconductor devices of the gradient amplifiers are drastically reduced which thus increases the lifetime of these power devices.

In case of applying the assembly according to the invention to power semiconductor devices used in gradient amplifiers of magnetic resonance scanners, it is either possible to use the above mentioned types of controllers, i.e. feedback, feedforward controllers, controllers which regulate the switching frequency of the power modules, or combinations thereof, or it is possible to additionally use the information of gradient amplifier control originating from an actually applied magnetic resonance pulse sequence. In this case, it is even possible to adjust the cooling efficiency of the heat sink in advance predicting a future temperature behavior of the high current carrying semiconductor junction by analyzing a further progression of the MR gradient amplifier system by analyzing the used magnetic resonance pulse sequence.

In another aspect, the invention relates to a method of operating a power semiconductor device cooling assembly for cooling a power semiconductor device, wherein the assembly comprises an actively cooled heat sink and a controller, whereby the controller adjusts the cooling efficiency of the heat sink depending on the temperature of the high current carrying semiconductor junction of the power semiconductor device.

In accordance with an embodiment of the invention, the method further comprises receiving a temperature signal, the temperature signal specifying an actual temperature value of the high current carrying semiconductor junction and adjusting the cooling efficiency of the heat sink depending on the temperature signal.

In accordance with a further embodiment of the invention, the method further comprises adjusting the cooling efficiency of the heat sink depending on the desired or measured output power level of the power semiconductor device, wherein said adjustment is performed using a predicted thermal power dissipation of the power semiconductor device using a model, the model predicting the thermal power dissipation against said output power level.

In another aspect, the invention relates to a computer program product comprising computer executable instructions to perform the method according to the invention.

BRIEF DESCRIPTION OF THE DRAWINGS

In the following preferred embodiments of the invention are described in greater detail by way of example only making reference to the drawings in which.

DETAILED DESCRIPTION

In the following, similar elements are denoted by the same reference numerals.

Figure 1:
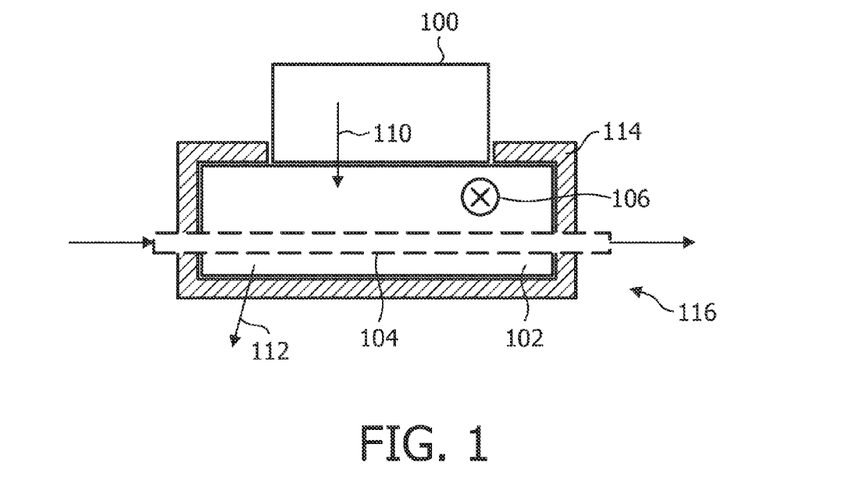
FIG. 1 illustrates a heat sink, on which a power semiconductor device is mounted.

FIG. 1 shows a schematic illustrating an assembly 116 comprising a heat sink 102 on which a power semiconductor device 100, for example an IGBT is mounted. The heat sink 102 comprises a thermal insulation 114 which limits an unwanted heat flow to the environment to a minimum. As a consequence, a thermal equilibration is only performed between the power semiconductor device 100 by means of a heat flow 110 and by means of a thermal contact of the heat sink with an active cooling medium.

The active cooling may be for example performed by means of an airflow flowing in direction 106 through a plurality of fins (not shown here) of the heat sink 102, or by means of a tube 104 being in thermal contact with the heat sink 102 through which a cooling fluid is transported. As a consequence, the temperature of the power semiconductor device is determined by the thermal resistance between the semiconductor device 100 and the heat sink 102, denoted by the heat flow 110, the thermal resistance between the heat sink and the ambient temperature, denoted by the heat flow 112, the thermal resistance between heat sink 102 and the cooling liquid flowing in tube 104 and the generated heat that flows from the power semiconductor device 100 through the heat sink 102 to the environment outside the insulation 114.

Apart from the thermal resistances, both the power device and the heat sink have thermal capacitances which define the amount of heat that can be stored. These thermal capacitances are contributory for the dynamic behavior of the cooling system. Generally, the heat sink will have a thermal capacitance that is much larger than the thermal capacity of the power device mounted to it. In other words, the temperature of the power device 100 can change much faster than the temperature of the heat sink 102. That means that the temperature of the device 100 will converge very rapidly to the temperature of the heat sink 102. In case the device 100 is operating the heat sink 104 will transport away efficiently the heat generated during operation of the device 100. However, as soon as an operation of the device 100 is stopped, in case no control of the cooling efficiency of the heat sink 102 is present the temperature of the heat sink 102 will drop rapidly. As a consequence, the temperature of the device 100 will also drop very rapidly to the now rather low temperature of the heat sink which leads to thermal stress for example between the die and the base of the power semiconductor device 100. As already explained above, such stress leads to material fatigue, thus limiting significantly the lifetime of the device 100.

Thus, by controlling the cooling efficiency of the heat sink 102, large temperature drops of the temperature of the device 100 and preferably and particularly of the high current carrying semiconductor junction of the power semiconductor device, and thus the thermal stress in the device 100 can be limited which will significantly increase the lifetime of said device.

Figure 2:
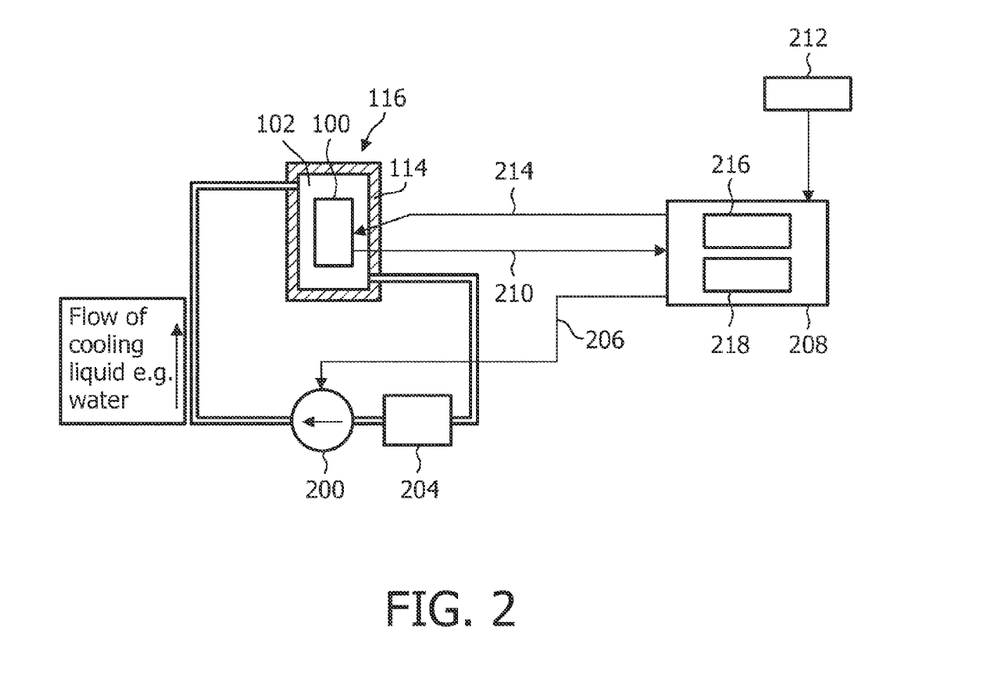
FIG. 2 illustrates a feedback version of a power semiconductor device cooling assembly.

FIG. 2 shows one embodiment in which this principle is applied by means of a feedback controller 208. The cooling assembly illustrated in FIG. 2 operates by means of the assembly 116 comprising a heat sink 102 which is isolated against the environment by means of an isolation 114. Mounted on the heat sink is the semiconductor power device 100. The heat sink 102 comprises the cooling channel, for example the tube through which a cooling liquid like for example water is flowing. Liquid is pumped by means of a pump 200 through the heat sink 102 in a loop to a heat exchanger 204, wherein the heat exchanger 204 extracts heat from the cooling liquid. The cooling efficiency of the heat sink 102 is controlled by means of a control signal provided from the feedback controller 208 by means of a control line 206 to the pump 200.

In order to control the pump 200, the controller 208 receives a temperature signal from the power device 100 by means of a temperature control line 210. The temperature signal specifies an actual temperature value of a high current carrying semiconductor junction of the power semiconductor device 100. In order to control the flow rate of the cooling liquid by means of the pump 200, the controller 208 comprises a processor 216 and a memory 218. By means of the processor and the memory, the controller 208 analyzes the temperature signal and adjusts the cooling efficiency of the heat sink 102 by regulating the flow of the cooling liquid.

In a further embodiment, the controller 208 comprises an input by which the controller can receive a control signal 212 of the power semiconductor device 100. For example, the power semiconductor device 100 is an H-bridge operating at a certain variable switching frequency. In this case, preferably the control signal 212 comprises said switching frequency. As already described above in detail, by additionally changing the switching frequency of the H-bridge 100, a further possibility is given which allows to control the temperature of the high current carrying semiconductor junction in such a manner that temperature variations of the junction are further damped. The actually used switching frequency may be calculated by means of the processor 216 and the memory 218 of the controller 208, the memory comprising a respective computer program product. The calculated switching frequency is communicated from the controller 208 to the device 100 by means of a control line 214.

Figure 3:
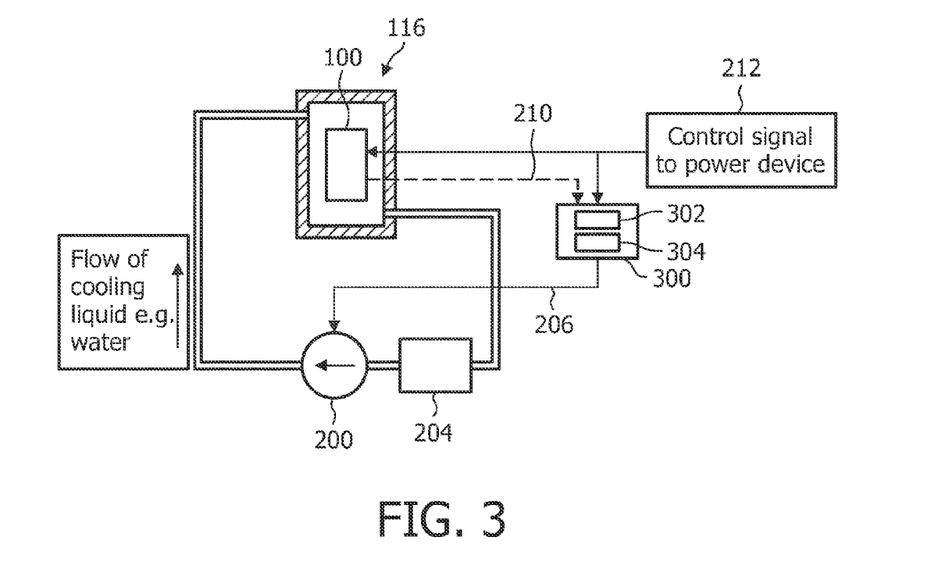
FIG. 3 illustrates a feedforward version of a power semiconductor device cooling assembly.

FIG. 3 shows a feedforward system which can be for example used where there is no possibility to measure directly the actual temperature or a temperature derivative of the power semiconductor device 100. The system is illustrated in FIG. 3 in combination with the usage of a cooling fluid in order to adjust the temperature of the heat sink assembly 116, but it can also be implemented using ventilators or any other cooling techniques known in the art with the requirement, that the cooling capacity of the system can be regulated.

The system consists of the power semiconductor device 100, e.g. an IGBT and a fluid cooled heat sink assembly 116.

The heat sink assembly 116 is part of a closed loop fluid cooling system that apart from the heat sink assembly 116 consists of the pump 200 to circulate the fluid and a heat exchanger 204 that extracts the heat that is transported from the heat sink. The flow rate is again controlled via the pump 200 by means of control signals provided from the controller 300 by means of a control line 206 to the pump 200. Preferably, the fluid flow through the pump 200 is controlled in such a manner that during full power demand of the device 100 a maximum cooling of the power device by means of the heat sink assembly 116 is achieved. When less or no power from the power device is required, the flow through the pump 200 is reduced or stopped completely in order to limit a too strong temperature decrease in the power device 100. In case no power from the power device 100 is needed but the flow through the pump would be kept at a level which corresponds to a maximum cooling capability, the temperature of the high current carrying semiconductor junctions of the power device 100 will drastically drop. As already mentioned above, this will lead to thermal material stress and thus limit significantly the lifetime of the power device 100.

In contrast, by controlling the pump 200 on the basis of the input control signal 212 of the power device 100, a thermal cycling of the power device 100 can be reduced. One of the key elements is a precise model-based prediction of the power dissipation in the high current carrying semiconductor junction of the semiconductor device 100. By means of a processor 302 and a memory 304 of the controller 300, an algorithm is applied which models a thermal power dissipation of the power semiconductor device using a model adapted for predicting a thermal power dissipation against for example a desired output power level provided with the control signal 212. The algorithm is typically determined during development of the power semiconductor device cooling assembly on the basis of its desired operation and the thermal behavior of the power device and the cooling system.

Even though, in FIG. 3 only a feedforward system is illustrated, the feedforward system of FIG. 3 can also be combined with the feedback system illustrated in FIG. 2. This is exemplary indicated in FIG. 3 by means of the signal transmission line 210 through which an additional temperature signal is provided from the power device to the controller 300. Further implemented by software for example in the memory 304 may be a selection module adapted for selecting between a feedback control mode and a feedforward control mode for adjusting the cooling efficiency, wherein in the feedback mode the adjustment of the cooling efficiency is performed depending on the temperature signal and wherein in the feedforward mode the adjustment of the cooling efficiency is performed depending on said desired or measured output power level of the power semiconductor device using the model, wherein the selection module is adapted to perform the selection based on the signal quality of the temperature signal.

Figure 4:
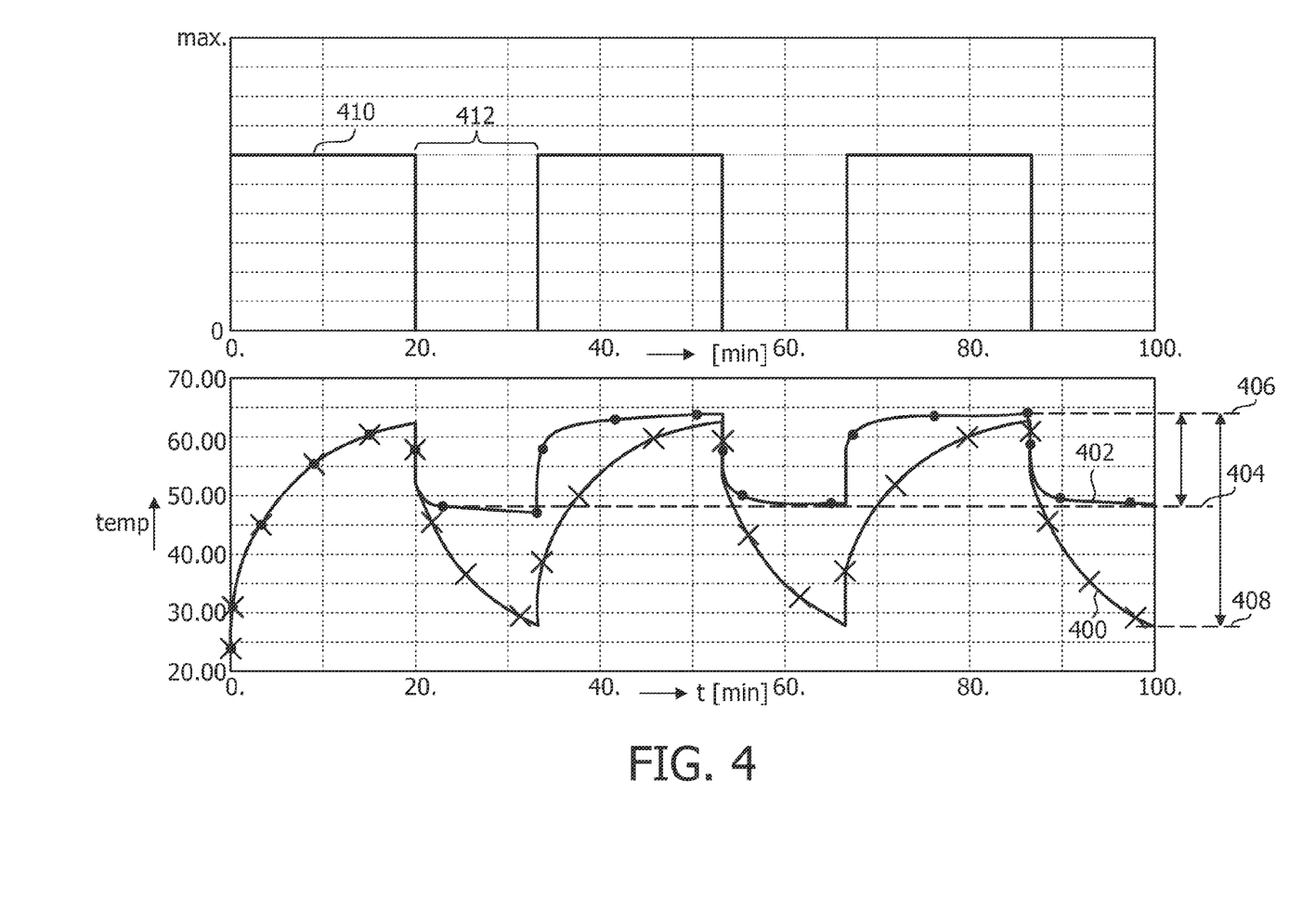
FIG. 4 shows simulations of the cooling behavior of classic cooling systems and a cooling system applying a power semiconductor device cooling assembly.

FIG. 4 shows simulations of the cooling behavior of a classic cooling system in which the temperature of the heat sink is not actively controlled depending on the temperature of the high current carrying semiconductor junction and the cooling behavior of a power semiconductor device cooling assembly according to the invention.

In the top diagram of FIG. 4, the power demand of the power semiconductor device is drawn in arbitrary units versus time. The power demand consists of blocks 410 of the duration of around 20 minutes, followed by a gap 412 of a duration of 12 minutes during which time no power is required from the power semiconductor device. Blocks 410 and 412 are continuously arranged one after another.

In the bottom diagram, the respective temperature of the high current carrying semiconductor junction of a power semiconductor device operated with the power demand illustrated in the top diagram is shown. The temperature is again given in arbitrary units versus time. Curve 400 illustrates the junction temperature in case a normal constantly cooled heat sink is used. As can be seen, after the block 410 with high power demand is finished, during the time gap 412 the temperature decreases strongly. In contrast, by actively adjusting the cooling efficiency of the heat sink depending on the actual temperature of the high current carrying semiconductor junction, either measured directly or predicted using an appropriate model, the temperature variation indicated by curve 402 is drastically reduced. In the case of the curve 402, the temperature oscillates between a maximum temperature value 406 and a minimum temperature value 404, whereas in case of the curve 400 the temperature oscillates in between a maximum temperature 406 and a minimum temperature 408. The minimum temperature 408 is far below the minimum temperature 404.

As a consequence, the amplitude of the thermal cycle of the semiconductor junction when applying the method according to the invention is much smaller compared to the amplitude of thermal cycle in case a constantly cooled heat sink is used, which as a consequence significantly increases the lifetime of a respective power device cooled by the method according to the invention.

Figure 5:
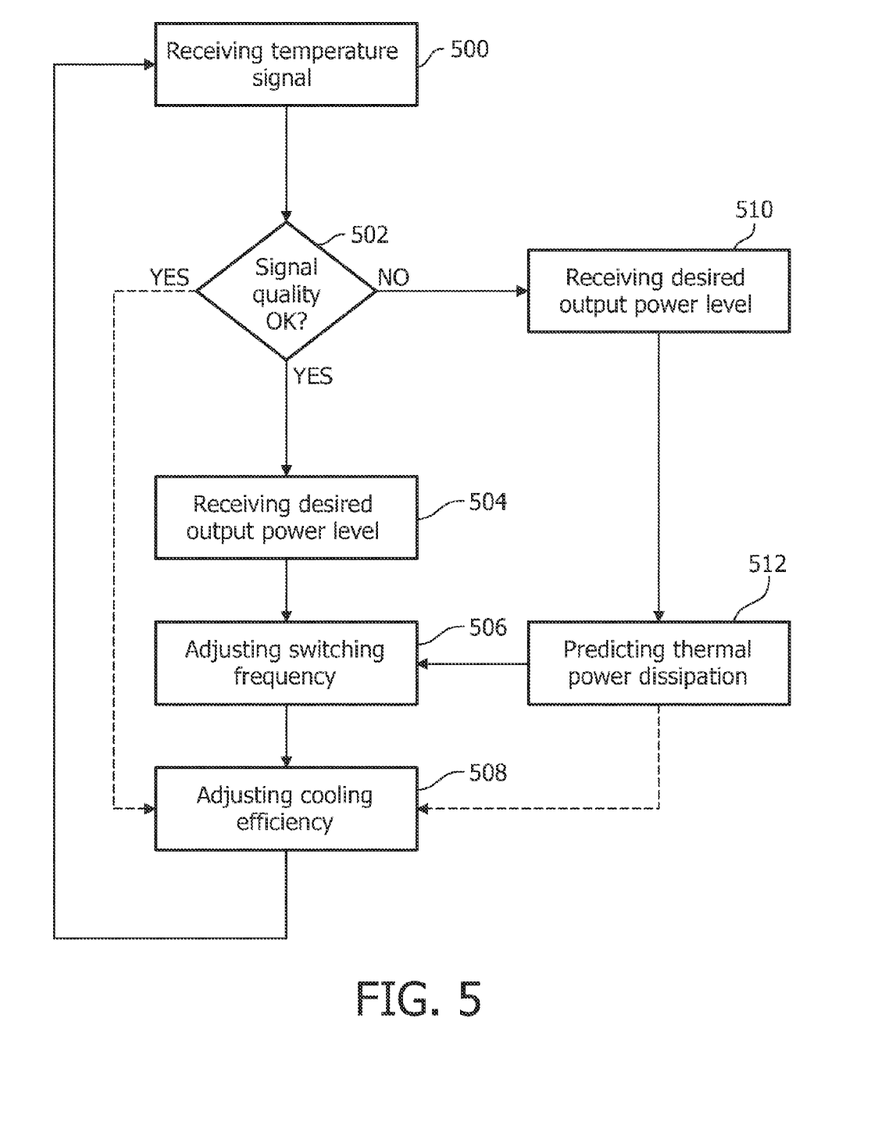
FIG. 5 is a flowchart illustrating a method of operating a power semiconductor device cooling assembly.

FIG. 5 is a flowchart illustrating the method of operating a power semiconductor device cooling assembly for cooling a power semiconductor device. The method steps illustrated in FIG. 5 are for a combination of a feedback and a feedforward control method, wherein as the actually applied control method an analysis of the temperature signal is performed, which is received in step 500. This temperature signal comprises an actual temperature of the high current carrying semiconductor junction comprised in the semiconductor device. If in step 502 it turns out that the signal quality for example given by the noise level in the temperature signal is sufficiently good, such that the temperature signal can be used for adjusting the cooling efficiency of the heat sink, the method in its simplest implementation continues with step 508, the adjustment of the cooling efficiency based on the received temperature signal. Alternatively, it is possible to continue after the decision in step 502 that the signal quality is okay, with step 504, in which a desired output level is received. This step is advantageous, in case the power semiconductor device is operated with a certain switching frequency, such that based on the temperature signal received in step 500 in step 506 the switching frequency can be adjusted which allows for a regulation of the temperature inside a power semiconductor device. After step 506, again in step 508 the cooling efficiency is adjusted based on the temperature signal received in step 500.

However, if step 502 returns that the signal quality is not sufficiently good in order to perform an adjustment of the cooling efficiency solely based on the temperature signal received in step 500, after step 502 the method continues with step 510, in which a desired output power level of the power semiconductor device is received. Based on this received output power level, in step 512 a thermal power dissipation of the high current carrying semiconductor junction is predicted using a model which emulates precisely the power dissipation in the power semiconductor. Either directly after step 512, step 508 with the adjustment of the cooling efficiency based on the predicted thermal power dissipation is performed, or after step 512 additional step 506 is carried out with adjusting the switching frequency of the power semiconductor device, in case the semiconductor device is operable with a certain switching frequency. After step 506, step 508 is following with the adjustment of the cooling efficiency.

After step 508 the method returns to step 500 such that the method illustrated in FIG. 5 is cyclical repeated.

It has to be noted, that the method illustrated in the flowchart does only correspond to one embodiment of the invention. As already discussed above, another embodiment is not only an exclusive selection of either the received temperature signal or the predicted thermal power dissipation, but also a combination thereof. For example, if in step 502 it is determined that in a certain frequency band the signal quality is not ok due to a higher noise level, steps 502, 504, 506, as well as steps 502, 510, 512 and 506 can be performed, such that in step 508 the cooling efficiency is adjusted using the predicted junction temperature as adjustment criterion in said frequency band and using the in step 500 received temperature signal as adjustment criterion outside said frequency band. However, a weighted combination thereof is also possible, wherein the weighting depends on the noise level. The higher the noise level, the lower the weighting of the noise comprising temperature signal will be.

LIST OF REFERENCE NUMERALS

100 power semiconductor device
102 heat sink
104 tube
106 airflow direction
110 heat flow
112 heat flow
114 insulation
116 heat sink assembly
200 pump
204 heat exchanger
206 signal transmission line
208 controller
210 temperature signal transmission line
212 control signal
214 control signal transmission line
216 processor
218 memory
300 controller
302 processor
304 memory
400 simulation
402 simulation
404 minimum value
406 maximum value
408 minimum value
410 block
412 gap

The invention claimed is:

1. Power semiconductor device cooling assembly for cooling a power semiconductor device, wherein the assembly comprises an actively cooled heat sink and a controller, wherein the controller is adapted for adjusting the cooling efficiency of the heat sink depending on the temperature of the high current carrying semiconductor junction comprised in the power semiconductor device, wherein the controller is adapted for receiving a temperature signal, the temperature signal specifying an actually measured temperature value of the high current carrying semiconductor junction, wherein the controller comprises a selection module adapted for selecting between a feedback control mode and a feedforward control mode for adjusting the cooling efficiency, wherein in the feedback mode the adjustment of the cooling efficiency is performed depending on the temperature signal and wherein in the feedforward mode the adjustment of the cooling efficiency is performed depending on a desired or measured output power level of the power semiconductor device using a model, the model being adapted for predicting the thermal power dissipation against said output power level, wherein the selection module is adapted to perform the selection based on the signal quality of the temperature signal.

2. The assembly of claim 1, wherein a measure of the signal quality of the temperature signal is given by the noise level in the temperature signal.

3. The assembly of claim 1, wherein the controller is adapted for adjusting the cooling efficiency of the heat sink depending on a combined temperature signal, the controller being adapted to generate the combined temperature signal by a weighted combination of the predicted thermal power dissipation of the power semiconductor device and the temperature signal in the time domain and/or the frequency domain.

4. The assembly of claim 3, wherein the controller is adapted to perform a noise weighted combination in the frequency domain.

5. The assembly of claim 1, wherein the power semiconductor device is operable with a switching frequency, wherein the controller is further adapted for adjusting the switching frequency depending on the desired or measured output power level of the power semiconductor device.

6. The assembly according to claim 1, wherein the heat sink is thermally isolated against the environment.

7. A nuclear magnetic resonance examination system comprising the assembly according to claim 1.

8. A method of operating a power semiconductor device cooling assembly for cooling a power semiconductor device, wherein the assembly comprises an actively cooled heat sink and a controller and a selection module, the method comprising by the controller adjusting the cooling efficiency of the heat sink depending on the temperature of the high current carrying semiconductor junction of the power semiconductor device, the method further comprising:

receiving a temperature signal, the temperature signal specifying an actually measured temperature value of the high current carrying semiconductor junction, selecting by the selection module between a feedback control mode and a feedforward control mode for adjusting the cooling efficiency, wherein in the feedback mode the adjustment of the cooling efficiency is performed depending on the temperature signal and wherein in the feedforward mode the adjustment of the cooling efficiency is performed depending on a desired or measured output power level of the power semiconductor device using a model, the model being adapted for predicting the thermal power dissipation of the power semiconductor device against said output power level, wherein the selection is performed based on the signal quality of the temperature signal.

9. A computer program product comprising computer executable instructions to perform the method steps as claimed in claim 8.

* * * * *